(12) United States Patent
Oohashi et al.

(10) Patent No.: US 7,543,259 B2
(45) Date of Patent: Jun. 2, 2009

(54) METHOD AND DEVICE FOR DECIDING SUPPORT PORTION POSITION IN A BACKUP DEVICE

(75) Inventors: Teruyuki Oohashi, Chiryu (JP); Takashi Kurashina, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 334 days.

(21) Appl. No.: 10/556,722

(22) PCT Filed: May 13, 2004

(86) PCT No.: PCT/JP2004/006762

§ 371 (c)(1),
(2), (4) Date: Nov. 14, 2005

(87) PCT Pub. No.: WO2004/103054

PCT Pub. Date: Nov. 25, 2004

(65) Prior Publication Data

US 2007/0073428 A1 Mar. 29, 2007

(30) Foreign Application Priority Data

May 16, 2003 (JP) .............................. 2003-138348

(51) Int. Cl.
*G06F 9/45* (2006.01)

(52) U.S. Cl. ....................... 716/8; 716/1; 716/5; 703/1; 703/13; 700/97

(58) Field of Classification Search .................. 700/95, 700/97, 114, 182; 716/1–15; 703/13–22, 703/1; 361/748, 758, 770, 749; 29/739, 29/740

See application file for complete search history.

(56) References Cited

U.S. PATENT DOCUMENTS

| 6,275,374 | B1 * | 8/2001 | Shin et al. ................... 361/758 |
| 6,633,488 | B1 * | 10/2003 | Morita ....................... 361/752 |
| 6,635,308 | B1 * | 10/2003 | Forrest et al. ................. 29/559 |
| 6,839,883 | B2 * | 1/2005 | Ahrikencheikh ............... 716/1 |
| 6,839,885 | B2 * | 1/2005 | Ahrikencheikh ............... 716/9 |
| 2004/0031000 | A1 * | 2/2004 | Ahrikencheikh ............. 716/4 |
| 2004/0040008 | A1 * | 2/2004 | Ahrikencheikh ............. 716/15 |

FOREIGN PATENT DOCUMENTS

| JP | 06-169198 | 6/1994 |
| JP | 06-260795 | 9/1994 |

\* cited by examiner

*Primary Examiner*—Albert DeCady
*Assistant Examiner*—Charles R Kasenge
(74) *Attorney, Agent, or Firm*—Oblon, Spivak, McClelland, Maier & Neustadt, P.C.

(57) ABSTRACT

A host computer 80 for wholly controlling an electronic component mounting line displays a surface side image and a reverse side image which respectively show a surface side and a reverse side of a board having components mounted thereon, with the images being superposed; displays components mounted on the surface side of the board and components mounted on the reverse side in visually different modes; and designates and determines the positions of support places of a backup device on the displayed superposed image (step 108).

7 Claims, 10 Drawing Sheets

FIG. 6

| Mounting Order | Component ID | Coordinate (X, Y) | Electronic Component Mounting Apparatus |
|---|---|---|---|
| 1 | Xaa | X6, Y6 | 1st Electronic Component Mounting Apparatus |
| 2 | Xcc | X7, Y7 | 1st Electronic Component Mounting Apparatus |
| 3 | Xcc | X8, Y8 | 1st Electronic Component Mounting Apparatus |
| 4 | Xdd | X9, Y9 | 2nd Electronic Component Mounting Apparatus |
| 5 | Xdd | X10, Y10 | 2nd Electronic Component Mounting Apparatus |
| 6 | Xdd | X11, Y11 | 2nd Electronic Component Mounting Apparatus |
| 7 | Xbb | X5, Y5 | 2nd Electronic Component Mounting Apparatus |
| 8 | Xcc | X12, Y12 | 3rd Electronic Component Mounting Apparatus |
| 9 | Xcc | X13, Y13 | 3rd Electronic Component Mounting Apparatus |
| 10 | Xcc | X14, Y14 | 3rd Electronic Component Mounting Apparatus |
| 11 | Xee | X15, Y15 | 3rd Electronic Component Mounting Apparatus |
| 12 | Xee | X16, Y16 | 3rd Electronic Component Mounting Apparatus |
| 13 | Xee | X17, Y17 | 3rd Electronic Component Mounting Apparatus |
| 14 | Xee | X18, Y18 | 3rd Electronic Component Mounting Apparatus |

Production Program (Mounting Program)

| Pin ID | Setting of Support Place | Coordinate (X, Y) | RefList |
|---|---|---|---|
| 1 | Flexure Prevention Support | X1, Y1 | — |
| 2 | Flexure Prevention Support | X2, Y2 | — |
| 3 | Flexure Prevention Support | X3, Y3 | — |
| 4 | Flexure Prevention Support | X4, Y4 | — |
| 5 | Particular Component Support | X5, Y5 | Xbb |
| 6 | Particular Component Support | X6, Y6 | Xaa |

Backup Pin Coordinate Data

FIG. 11

| order | Pin ID |
|---|---|
| 1 | 1 |
| 2 | 5 |
| 3 | 2 |
| 4 | 3 |
| 5 | 6 |
| 6 | 4 |

Backup Pin Planting Sequence Data

FIG. 12

| Feeder ID | RefList |
|---|---|
| 1 | ... |
| 2 | Xcc |
| 3 | ... |
| 4 | ... |
| 5 | Xaa |

Feeder Setup Data for 1st Electronic Component Mounting Apparatus (a)

| Feeder ID | RefList |
|---|---|
| 1 | Xdd |
| 2 | Xbb |
| 3 | ... |
| 4 | ... |
| 5 | ... |

Feeder Setup Data for 2nd Electronic Component Mounting Apparatus (b)

| Feeder ID | RefList |
|---|---|
| 1 | ... |
| 2 | Xcc |
| 3 | Xee |
| 4 | ... |
| 5 | ... |

Feeder Setup Data for 3rd Electronic Component Mounting Apparatus (c)

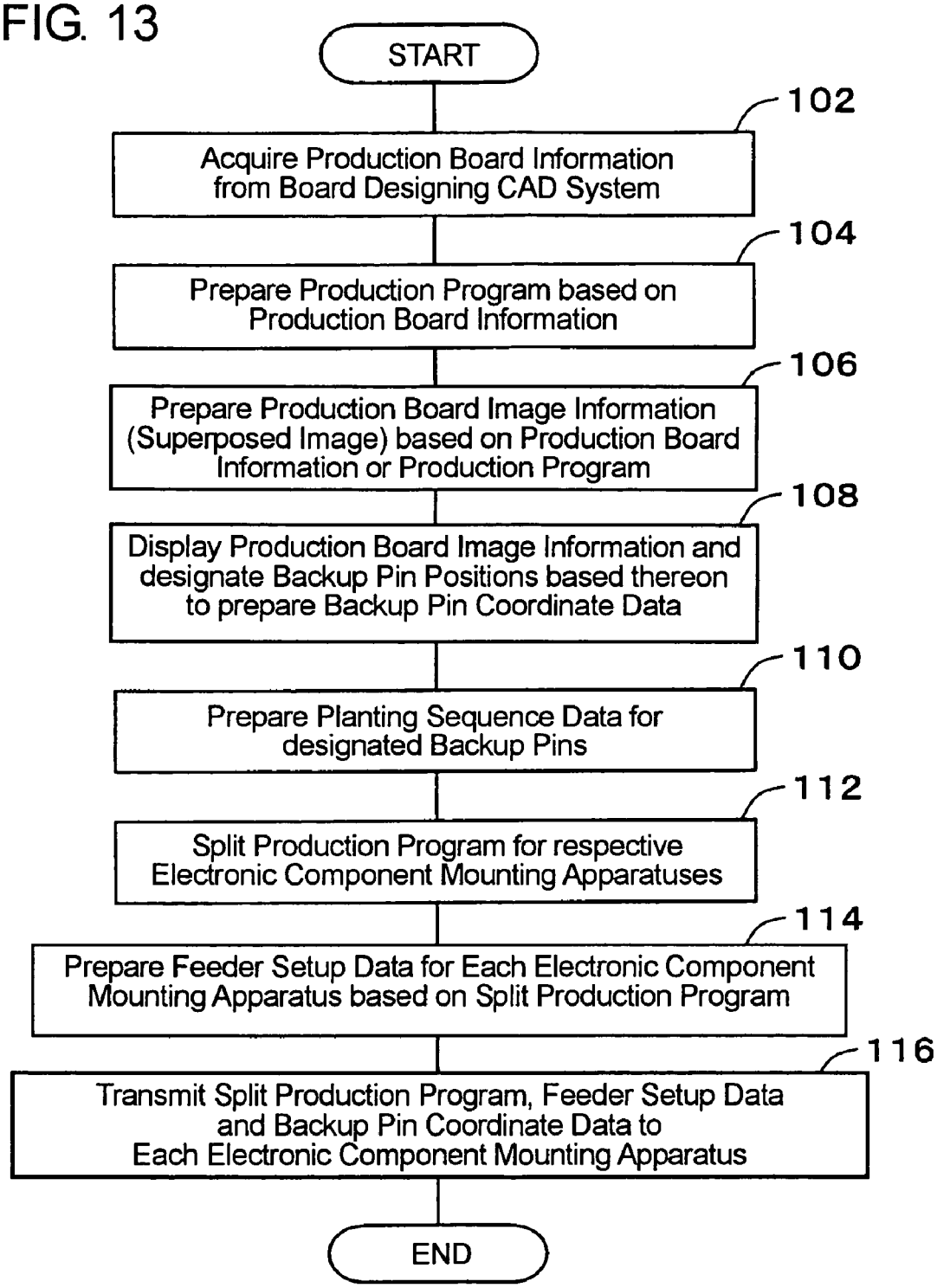

| order | Pin ID | Coordinate |
|---|---|---|
| 1 | 1 | X1, Y1 |
| 3 | 2 | X2, Y2 |
| 4 | 3 | X3, Y3 |
| 5 | 6 | X6, Y6 |
| 6 | 4 | X4, Y4 |

Pin Planting
Sequence Data for
1st Electronic Component
Mounting Apparatus (a)

| order | Pin ID | Coordinate |
|---|---|---|
| 1 | 1 | X1, Y1 |
| 2 | 5 | X5, Y5 |
| 3 | 2 | X2, Y2 |
| 4 | 3 | X3, Y3 |
| 6 | 4 | X4, Y4 |

Pin Planting
Sequence Data for
2nd Electronic Component
Mounting Apparatus (b)

| order | Pin ID | Coordinate |
|---|---|---|
| 1 | 1 | X1, Y1 |
| 3 | 2 | X2, Y2 |
| 4 | 3 | X3, Y3 |
| 6 | 4 | X4, Y4 |

Pin Planting
Sequence Data for
3rd Electronic Component
Mounting Apparatus (c)

METHOD AND DEVICE FOR DECIDING SUPPORT PORTION POSITION IN A BACKUP DEVICE

TECHNOLOGICAL FIELD

The present invention relates to a support place position determination method and a support place position determination device for determining the positions of support places of a backup device which supports a board.

BACKGROUND ART

Heretofore, there has been well known a backup device which constitutes an electronic component mounting apparatus for mounting components on a board and which supports the board. As the backup device, there is one in which plural backup pins for supporting a board at the reverse side in mounting electronic components are planted to be removably insertable into plural pin holes opening on a backup plate. In the backup device, the backup pins have practically been planted at positions where the backup pins are to be planted in dependence on the kinds of boards to be produced. That is, the positions for enabling the backup pins to support the board are distinguished in dependence on the kind of each board, and the planting positions for the pins are indicated to a worker by displaying the distinguished planting positions for the pins on a display device, by printing them by a printer or by lighting the pin holes. Thus, the worker is enabled to plant the backup pins at the indicated planting positions for the pins. (Patent Document 1)

The pin planting positions in the backup device have been determined by an information processing device for controlling the mounting operations of electronic components, as follows: The information processing device makes reference to information about the size, shape and the like of a board to have electronic components mounted thereon and if the board has mounted electronic components on the reverse side, also makes reference to the electronic component mounting positions on the reverse side. The information processing device then excludes pin planting positions which are not encompassed in an area corresponding to the size and shape of the board, from the positions of plural pin holes opening on the backup plate, that is, from all of the pin planting positions, and in the case of the board having electronic components mounted on the reverse side, further excludes pin planting positions encompassed within the areas which overlap the electronic component mounting positions. As a result, pin planting positions which are left finally are distinguished (determined) as the planting positions for the backup pins which are able to support the board.

On the other hand, with the speeding-up of the mounting tact-time, there arises a problem that the mounting position for a component is made off the target by the shock at the time of the component mounting operation. This problem becomes serious in the case of components (e.g., QFP, SOP, BGA, CSP etc.) which are required to be mounted with particularly high precision. To cope with this, there has been conceived an idea of using backup pins (support places) to support a reverse side portion corresponding to a mounting position for the component which is required to be mounted highly precisely so that the shock at the time of the mounting operation can be suppressed to be as small as possible.

The patent document 1 is Japanese unexamined, published patent application No. 6-169198 (Pages 3, 4 and FIGS. 2-4).

In the aforementioned method of determining the pin planting positions, the overall area in which the pins are enabled to be planted can be distinguished, but the precise mounting positions for components which are required to be mounted highly precisely cannot be distinguished, so that it is unable to plant the pins at right positions.

SUMMARY OF THE INVENTION

The present invention is made to solve the aforementioned problems, and it is an object of the present invention to provide a support place position determination method and a support place position determination device for determining the right positions for support places by simultaneously indicating the mounting position for any component which is required to be mounted highly precisely, within the area in which the support places can be arranged.

The present invention resides in a support place position determination method in a backup device of determining the positions of support places of the backup device which supports a board at a support surface on a reverse side of a component mounting surface in mounting components on the board by an electronic component mounting apparatus, and the method comprises a superposed image display step of displaying a surface side image and a reverse side image which respectively show a surface side and a reverse side of the board having components mounted thereon, with the images being superposed, and of displaying the components having been mounted on the surface side of the board and the components having been mounted on the reverse side in visually different modes; and a support place position determination step of designating and determining the positions of the support places of the backup device on the superposed image being displayed at the superposed image display step.

With this construction, prior to mounting components on the surface side and reverse side of the board by the electronic component mounting apparatus, a worker recognizes the mounting surface for each component by reference to the superposed image being displayed at the superposed image display step, designates the positions of the support places while avoiding the components on the support surface based on such recognition; and then, designates as the position for a support place a reverse side portion corresponding to a mounting side portion where a component is to be mounted highly precisely. Thus, it can be done to determine the positions of the support places properly.

In the support place position determination method in the backup device according to the present invention, at the superposed image display step, the components having been mounted on the surface side of the board and the components having been mounted on the reverse side of the board are displayed to be switched in display mode. With this construction, in mounting components on the surface side and the reverse side of a board by the electronic component mounting apparatus, it can be realized to display a superposed image accurately regardless of whether the mountings are performed first from the surface side or first from the reverse side.

In the support place position determination method in the backup device according to the present invention, there is included a determination inhibition step of inhibiting the determination at the support place position determination step if the position of any support place determined at the support place position determination step is within an area which causes an interference with a component on the support surface. With this construction, it can be avoided reliably to erroneously set the position of each support place on any component having been mounted on a support surface of the board.

The present invention resides in a support place position determination device for determining the positions of support places of a backup device which supports a board at a support surface on a reverse side of a component mounting surface in mounting components, and the device comprises display means for displaying a surface side image and a reverse side image which respectively show a surface side and a reverse side of the board having components mounted thereon, with the images being superposed, and for displaying components having been mounted on the surface side of the board and components having been mounted on the reverse side in visually different modes; and support place position determination means for designating and determining the positions of the support places of the backup device on the superposed image being displayed by the display means.

With this construction, prior to mounting components on the surface side and reverse side of the board by the electronic component mounting apparatus, the worker recognizes the mounting surface for each component by reference to the superposed image being displayed by the superposed image display means, designates the positions of the support places while avoiding the components on the support surface based on such recognition; and then, designates as the position for a support place a reverse side portion corresponding to a mounting side portion where a component is to be mounted highly precisely. Thus, it can be done to determine the positions of the support places properly.

The present invention resides in a support place position determination aiding device comprising a display section control device for controllably displaying in a display section a surface side image and a reverse side image which respectively show a surface side and a reverse side of the board having components mounted thereon; a support place position designation device capable of designating the positions of support places of a backup device for supporting a board, at desired positions on the surface side image and/or the reverse side image being displayed in the display section; and a superposed image preparation device for superposing the surface side image and the reverse side image to prepare a superposed image; wherein the display section control device controllably displays the surface side image and the reverse side image included in the superposed image in visually different modes.

With this construction, in the support place position determination aiding device in the backup device, the surface side image and the reverse side image included in the superposed image are displayed in the visually different modes, and the worker designates the positions of the support places while avoiding any component on the support surface by reference to the superposed image being displayed and further designates as the place for a support place a reverse side portion corresponding to a mounting side portion where a component is to be mounted highly precisely, by the use of the support place position determination aiding device. Therefore, it is possible to aid the worker in determining the positions of the support places reliably and accurately.

The present invention resides in a support place position determination method in a backup device of determining the positions of support places of the backup device which supports a board at a support surface on a reverse side of a component mounting surface in mounting components on the board by one or plural electronic component mounting apparatuses, and the method includes a support place position determination step of designating and determining the positions of the support places of the backup device while setting each support place of the backup device to either a flexure preventing support place for preventing the flexure of the board or a particular component support place for supporting a particular component for which highly precise mounting is required.

With this construction, since setting is made as to whether each support place of the backup device is to serve as the flexure preventing support place for preventing the flexure of the board or as the particular component support place for supporting the particular component which requires highly precise mounting, it can be realized to usefully provide the support places necessary for each electronic component mounting apparatus. Accordingly, it becomes possible to reduce the cost involved in the works for setting the support places on the backup device and for exchanging the support places.

In the support place position determination method in the backup device according to the present invention, there is further included a support object component correlating step of correlating a support place which is set to the particular component support place at the support place position determination step, with information about a particular component to be supported by the support place. With this construction, in addition to the foregoing functions and effects, it can be realized to confirm the component which is to be supported by the particular component support place.

In the support place position determination method in the backup device according to the present invention, there is further included a support place position determination step dedicated to each electronic component mounting apparatus, and the dedicated support place position determination step is a step which is independently executed in the associated electronic component mounting apparatus and which is of determining the positions of support places used in the associated electronic component mounting apparatus by reference to support place data and mounting component data, the support place data being prepared through the support place position determination step and the support object component correlating step and being composed of positions relating to all the support places for supporting the board, setting states of the support places and support object components, and the mounting component data designating those components, whose mountings are to be performed by the associated electronic component mounting apparatus, of components to be mounted on the board. With this construction, in addition to the foregoing functions and effects, it can be realized to reliably determine the support places which are required in each of the electronic component mounting apparatus.

The present invention resides in a support place position determination device for determining the positions of support places of a backup device which supports a board at a support surface on a reverse side of a component mounting surface in mounting components, and the device is provided with support place position determination means for designating and determining the positions of the support places of the backup device while setting each support place of the backup device to either a flexure preventing support place for preventing the flexure of the board or a particular component support place for supporting a particular component for which highly precise mounting is required.

With this construction, since setting is made as to whether each support place of the backup device is to serve as the flexure preventing support place for preventing the flexure of the board or as the particular component support place for supporting the particular component which requires highly precise mounting, it can be realized to usefully provide the support places necessary for each electronic component mounting apparatus. Accordingly, it becomes possible to reduce the cost involved in the works for setting the support places on the backup device and for exchanging the support places.

BRIEF DESCRIPTION OF THE DRAWINGS

FIG. 6 is a table representing a production program prepared by the host computer shown in FIG. 1;

FIG. 10 is a table showing coordinate data for backup pins prepared by the host computer shown in FIG. 1;

FIG. 11 is a table showing planting position sequence data for backup pins prepared by the host computer shown in FIG. 1;

FIG. 12(a) is a table showing feeder setup data for a first electronic component mounting apparatus;

FIG. 12(b) is a table showing feeder setup data for a second electronic component mounting apparatus;

FIG. 12(c) is a table showing feeder setup data for a third electronic component mounting apparatus;

FIG. 13 is a flow chart showing a program executed by the host computer shown in FIG. 1;

FIG. 15(a) is a table showing the coordinate data and the planting positions of backup pins for the first electronic component mounting apparatus;

FIG. 15(b) is a table showing the coordinate data and the planting positions of backup pins for the second electronic component mounting apparatus;

FIG. 15(c) is a table showing the coordinate data and the planting positions of backup pins for the third electronic component mounting apparatus;

PREFERRED EMBODIMENT TO PRACTICE THE INVENTION

Figure 1:
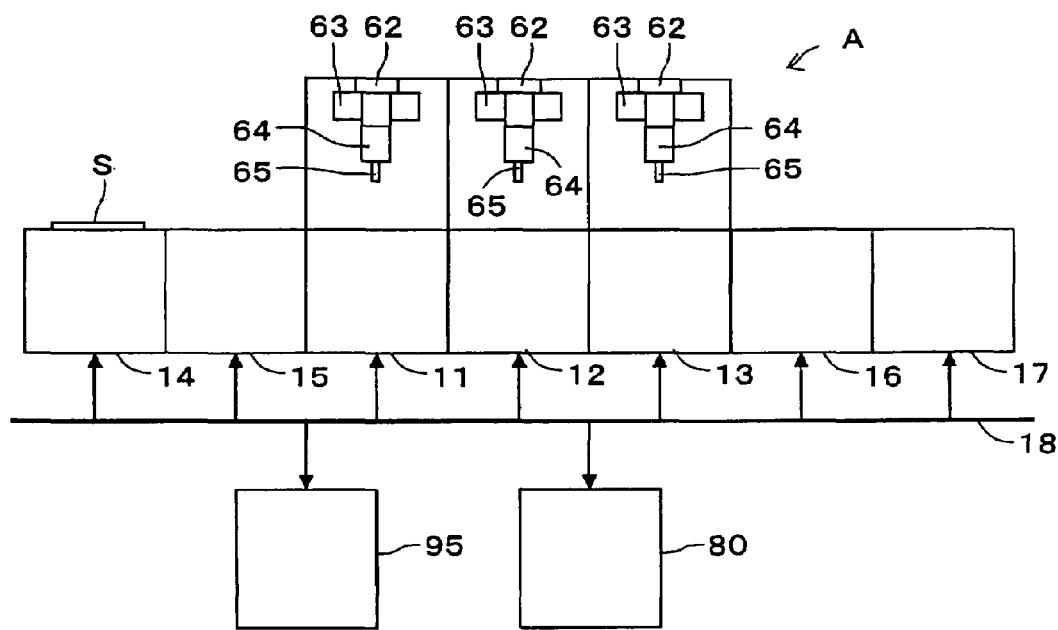
FIG. 1 is a schematic view showing an electronic component mounting line which has applied thereto a support place position determination method and a support place position determination device in one embodiment according to the present invention.
Figure 2:
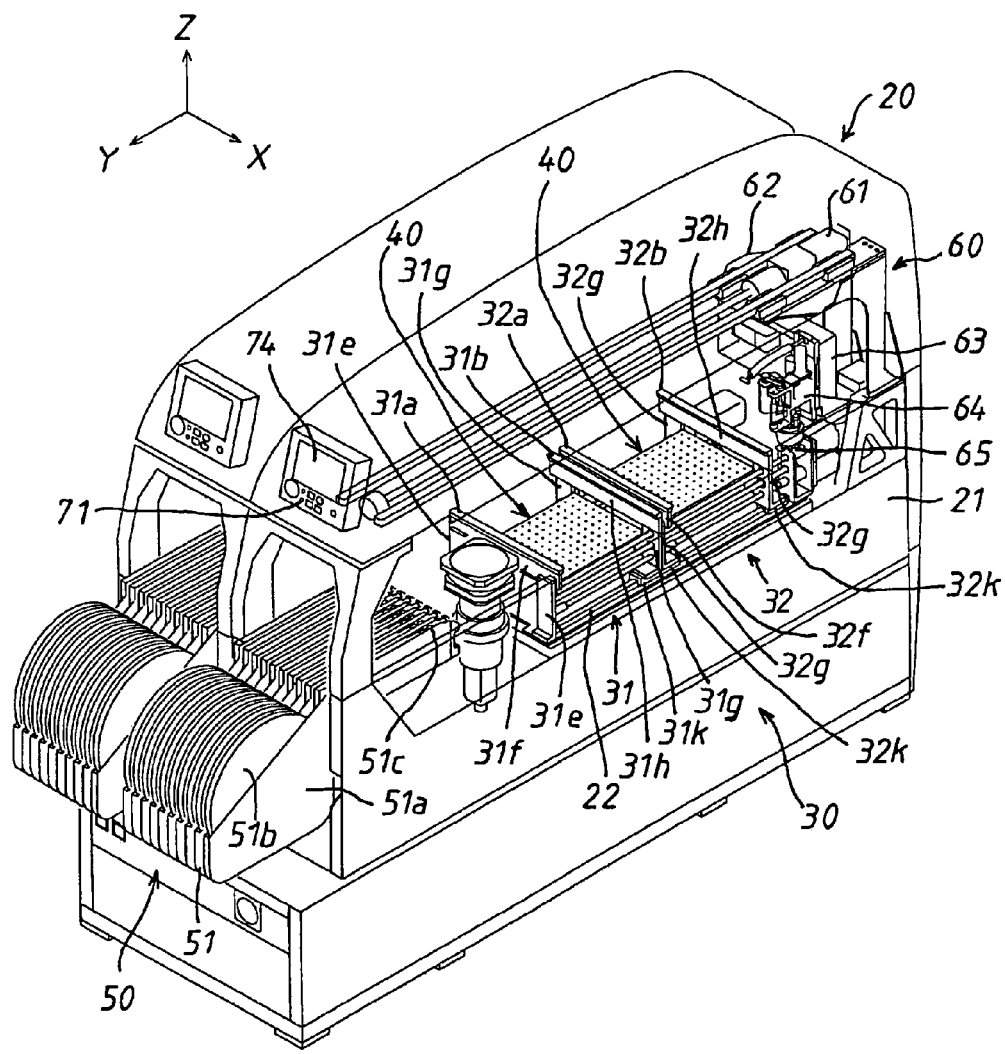
FIG. 2 is a perspective view showing the entire constructions of electronic component mounting apparatuses shown in FIG. 1.

Hereafter, description will be made regarding an electronic component mounting line in one embodiment which has applied thereto a support place position determination method and a support place position determination device according to the present invention. FIG. 1 shows a schematic construction of the electronic component mounting line A, FIG. 2 shows the entire constructions of electronic component mounting apparatuses, and FIG. 3 mainly shows a sectional view of a backup device. It is to be noted that FIG. 2 shows two electronic component mounting apparatuses mounted on a single base.

The electronic component mounting line A takes the construction that first to third electronic component mounting apparatuses 11 to 13, that is, three electronic component mounting apparatuses 20 are arranged in series. A solder printer 14 for applying cream solder to predetermined places on each board S and an adhesive application machine 15 for applying component adhering adhesive to component mounting positions if need be are arranged in order on an upstream side of the first electronic component mounting apparatus 11, while a mounting inspection machine 16 for inspecting the mounting state of components and a reflow soldering device 17 for soldering the components on each board S are arranged in order on a downstream side of the third electronic component mounting apparatus 13. Each of the electronic component mounting apparatuses 11 to 13, the solder printer 14, the adhesive application machine 15, the mounting inspection machine 16 and the reflow soldering device 17 are connected to a host computer 80 through a local area network (hereafter as "LAN") 18 for mutual communication. The host computer 80 is connected to a board designing CAD system 95 through the LAN 18 for mutual communication.

As shown in FIG. 2, each electronic component mounting apparatus 20 is an electronic component mounting apparatus of a so-called "double truck conveyer type", and on a base 21, there are provided a board transfer device 30 for transferring boards S, backup devices 40 each for fixedly positioning each transferred board S in cooperation with the board transfer device 30, a component supply device 50 provided on one side of the board transfer device 30 for supplying electronic components, and a component mounting device 60 arranged over the devices 30, 40 and 50 for drawing and holding electronic components supplied from the component supply device 50 by a mounting head 64 to automatically mount the electronic components on the boards S positioned and supported on the board transfer device 30.

The board transfer device 30 is for transferring the boards S in a predetermined direction (an X-direction in FIG. 2) and is provided with first and second conveyers 31, 32 assembled on the base 21 in parallel relation with each other.

Figure 3:
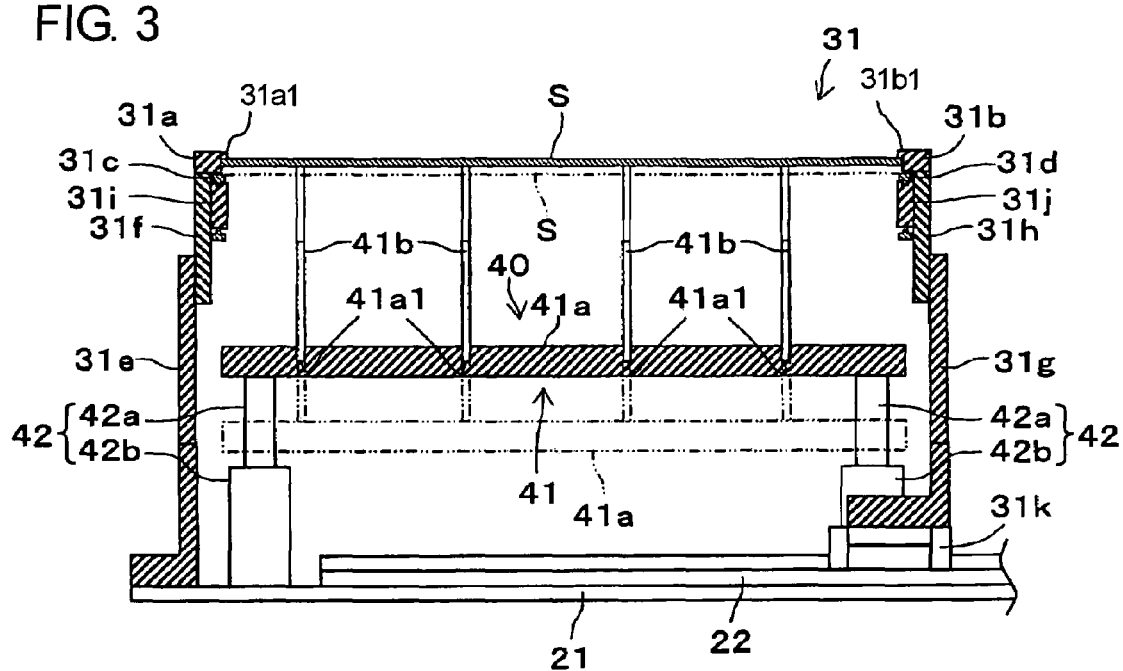
FIG. 3 is a sectional view of a backup device shown in FIG. 2.

As shown in FIG. 2, the first conveyer 31 is provided with first and second guide rails 31a, 31b which are arranged to extend in the transfer direction in parallel to each other, and the first and second guide rails 31a, 31b guide each board S in the transfer direction. On the upper ends of the first and second guide rails 31a, 31b, engaging portions 31a1, 31b1 respectively protruding inward are provided over the entire lengths thereof (refer to FIG. 3). In the first conveyer 31, as shown in FIG. 3, first and second conveyer belts 31c, 31d are juxtaposed respectively under the first and second guide rails 31a, 31b to extend in parallel relation to each other. The first and second conveyer belts 31c, 31d support the board S and transfer the same in the transfer direction.

As shown mainly in FIG. 3, the first guide rail 31a and the first conveyer belt 31c of the first conveyer 31 are attached to a first attaching frame 31f which is fixed at its opposite ends on the upper ends of a pair of stationary support frames 31e fixed at lower ends thereof on the base 21 and which is elongate to extend in the X-axis direction. Further, the second guide rail 31b and the second conveyer belt 31d of the first conveyer 31 are attached to a second attaching frame 31h which is fixed at its opposite ends on the upper end of a movable support frame 31g and which is elongate to extend in the X-axis direction. The movable support frame 31g is fixed at its lower end on a slider 31k which is movable on a pair of rails 22 fixed on the base 21. Thus, the second guide rail 31b is moved together with the second conveyer belt 31d thereunder in a direction (Y-direction) perpendicular to the transfer direction and is fixedly positioned, so that the conveyer width of the first conveyer 31 can be altered in correspondence to the board width of each board S to be transferred. The first and second attaching frames 31f, 31h have first and second support plates 31i, 31j attached thereto which support the first and second conveyer belts 31c, 31d in contact with the lower surfaces of the same, respectively.

The second conveyer 32 differs from the first conveyer 31 only in a respect that a first attaching frame 32f is movable, and takes substantially same construction as the first conveyer 31. Specifically, as shown in FIG. 2, the second conveyer 32 is provided with first and second guide rails 32a, 32b which are arranged to extend in the transfer direction in parallel relation to each other, and the first and second guide rails 32a, 32b guide each board S in the transfer direction. On the upper ends of the first and second guide rails 32a, 32b, engaging portions (not shown) respectively protruding inward are provided over the entire lengths thereof. In the second conveyer 32, first and second conveyer belts (not shown) are juxtaposed respectively under the first and second guide rails 32a, 32b to extend in parallel relation to each other. The first and second conveyer belts support each board S and transfer the same in the transfer direction.

As shown in FIG. 2, the first guide rail 32a and the first conveyer belt thereunder of the second conveyer 32 are attached to a first attaching frame 32f which is fixed at its opposite ends on the upper end of a movable support frame 32g and which is elongate to extend in the X-axis direction. The movable support frame 32g is fixed at its lower end on a slider 32k which is movable along the paired rails 22 fixed on the base 21. Further, the second guide rail 32b and the second conveyer belt thereunder of the second conveyer 32 are attached to a second attaching frame 32h which is fixed at its opposite ends on the upper end of a movable support frame 32g and which is elongate to extend in the X-axis direction. The movable support frame 32g is fixed at its lower end on a slider 32k which is movable on the paired rails 22 fixed on the base 21. Thus, the first and second guide rails 32a, 32b are moved together with the first and second conveyer belts thereunder in the direction (Y-direction) perpendicular to the transfer direction and are fixedly positioned, so that the conveyer width of the second conveyer 32 can be altered in correspondence to the board width of each board S to be transferred.

As shown in FIG. 3, the base 21 is provided thereon with the backup devices 40 each for upwardly pushing a board S, which is transferred by the board transfer device 30 to a mounting position, to clamp (position and support) the board S. Each backup device 40 is provided with a board support unit 41 for supporting the board S and elevator devices 42 for moving the board support unit 41 up and down. The board support unit 41 is composed of a rectangular backup plate 41a having a plurality of planting holes 41a1 at an upper surface thereof and backup pins 41b removably planted in the planting holes 41a1 and serving as support places for supporting the board S. The elevator devices 42 are constituted by air cylinders, which include rods 42a removably assembled to four corners of the backup plate 41a and cylinder bodies 42b for advancing and retracting the rods 42a.

The backup device 40 as constructed above holds the board support unit 41 at its lowered position (indicated by the two-dot-chain line in FIG. 3) during any other time than mounting the components. When the board S is transferred by the board transfer device 30 to be stopped (as indicated by the two-dot-chain line in FIG. 3) the backup device 40 upwardly moves the board support unit 41 by the operations of the elevator devices 42 and upwardly pushes the board S to hold the same at a raised position (indicated by the solid line in FIG. 3) and to keep that state until the mountings of the components are completed. Then, upon completion of the component mountings, the backup device 40 lowers the board support unit 41 to the lowered position.

In each electronic component mounting apparatus 20, the component supply device 50 is arranged on one side of the board transfer device 30, as shown in FIG. 2, and the component supply device 50 is provided with a plurality of removable cassette-type feeders (component supply cassettes) 51 arranged in juxtaposed relation. Each of the cassette-type feeders 51 is provided with a main body 51a, a supply reel 51b provided at the rear part of the main body 51a, and a component takeout section 51c provided at the front part of the main body 51a. The supply reel 51b winds and holds therearound a long tape (not shown) enclosing electronic components therein at a predetermined interval, and the tape is drawn out by a sprocket (not shown) at the predetermined interval, whereby the electronic components are successively fed to the component takeout section 51c as they are released from the enclosed state. Not only the cassette-type one but also a tray-type one having electronic components arranged on a tray may be used as the component supply device 50.

As shown in FIG. 2, each electronic component mounting apparatus 20 is provided with the component mounting device 60 over the board transfer device 30. The component mounting device 60 is of an XY robot type and is provided with a Y-direction movable slider 62 which is movable by a Y-axis servomotor 61 in the Y-direction. The Y-direction movable slider 62 carries an X-direction movable slider 63 which is movable by an X-axis servomotor (not shown) in a horizontal X-direction perpendicular to the Y-direction. The X-direction movable slider 63 has attached thereto a mounting head 64 which is carried to be movable vertically in a Z-direction perpendicular to the X-direction and the Y-direction and which is controllable by a servomotor through a ball screw to be moved up and down. The mounting head 64 has attached thereto a suction nozzle 65 (refer to FIG. 1), which is provided to protrude downward from the mounting head 64 for drawing and holding an electronic component at its lowermost end.

Figure 4:
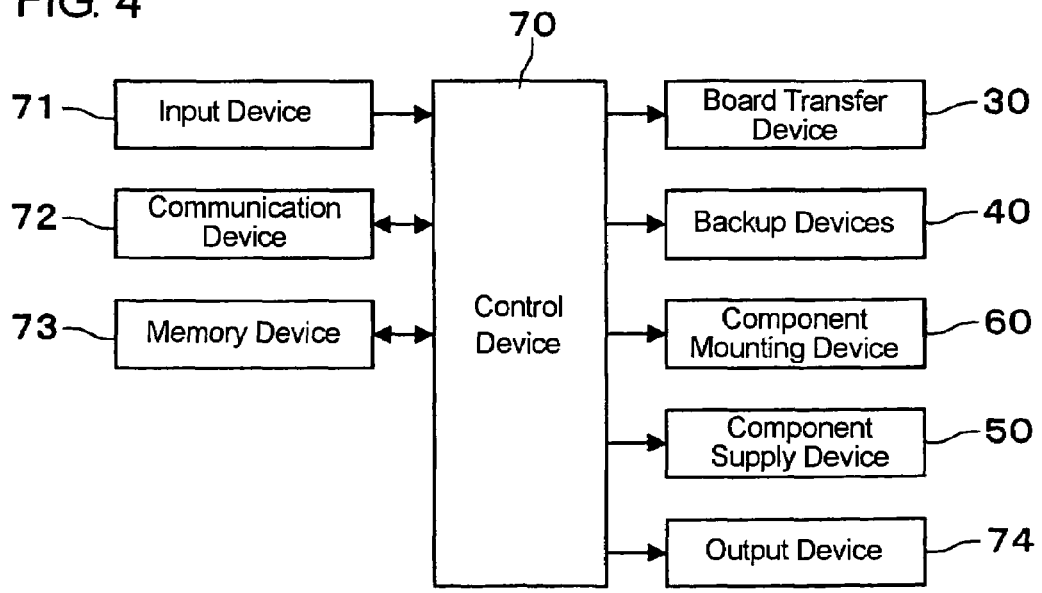
FIG. 4 is a function block diagram representing each electronic component mounting apparatus shown in FIG. 1.

Each electronic component mounting apparatus 20 constructed as mentioned above is provided with a control device 70 as shown in FIG. 4. The control device 70 has a microcomputer (not shown), which is provided with input/output interfaces, a CPU, a RAM and a ROM (all not shown) which are mutually connected through bus lines. The CPU executes a predetermined program to control the mountings of electronic components on boards and further executes a program corresponding to a flow chart shown in FIG. 14 to prepare backup pin coordinate data and planting sequence data for the backup device 40 of the associated electronic component mounting apparatus 20. The RAM is provided for temporarily storing variables necessary in executing the programs, while the ROM stores the programs.

The control device 70 has connected thereto an input device 71, a communication device 72, a memory device 73, the board transfer device 30, the backup devices 40, the component mounting device 60, the component supply device 50 and an output device 74. The input device 71 is provided for being manipulated by the worker to input commands, data and the like necessary for component mountings. The communication device 72 is provided for mutual communication with other devices and is connected to the host computer 80 via the LAN 18. The memory device 73 stores a system program for controlling the whole of the apparatus, control programs for individually controlling each of various devices of the apparatus under the system program, a production program and the backup pin coordinate data (all information) which are transmitted from the host computer 80 and which are split for the associated electronic component mounting apparatus, and the prepared coordinate data and planting sequence data (either of the data being information for exclusive use in the associate electronic component mounting apparatus) of the backup pins. The output device 74 displays status information about the electronic component mounting apparatus 20, warnings, and the prepared coordinate data and planting sequence data for the backup pins.

Figure 5:
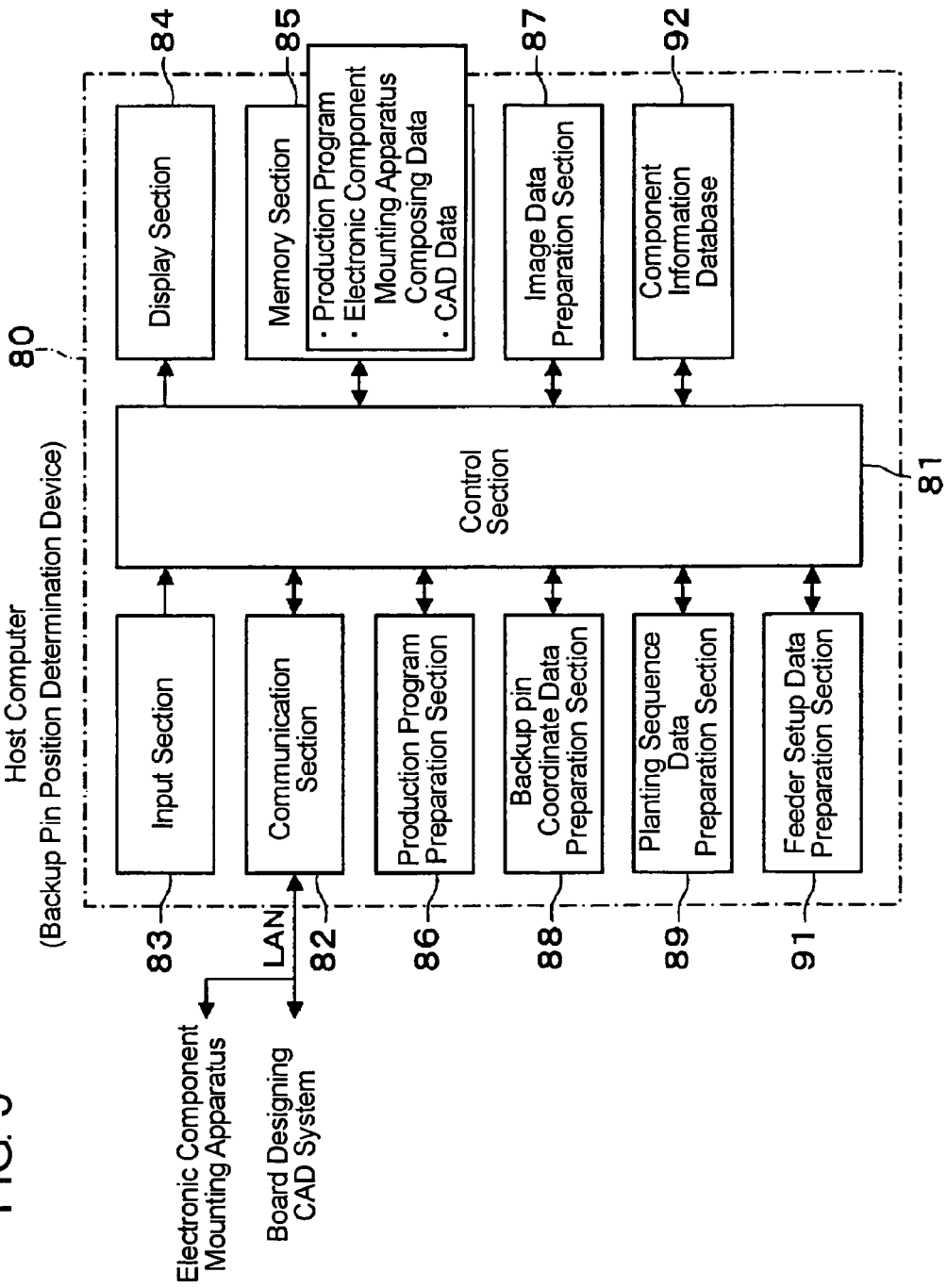
FIG. 5 is a function block diagram representing a host computer shown in FIG. 1.

The host computer 80 wholly controls the operation of each electronic component mounting apparatus 20 and wholly administers each electronic component mounting apparatus 20. As shown in FIG. 5, the host computer 80 is provided with a control section 81, and a communication section 82 connected to the control section 81 is connected to the electronic component mounting apparatuses 20 and the board designing CAD system 95 via the LAN 18. The control section 81 has a microcomputer (not shown), which is provided with input/output interfaces, a CPU, a RAM and a ROM (all not shown) which are mutually connected through bus lines. The CPU executes a program corresponding to a flow chart shown in FIG. 13 to execute the whole control of the operation for each electronic component mounting apparatus 20 and determines the positions of the backup pins 41b which are support places of the backup device 40. Specifically, the host computer 80 has a function as a support place position determination device. The RAM is for temporarily storing variables which are necessary for the execution of the programs, while the ROM stores the programs. The control section 81 also has a function as a display section control device which controllably displays in a display section 84 a surface side image and a reverse side image respectively showing the surface side and the reverse side of the board having components mounted thereon.

The control section 81 has connected thereto an input section 83, the display section 84, a rewritable memory section 85, a production program preparation section 86, an image data preparation section 87, a backup pin coordinate data preparation section 88, a planting sequence data preparation section 89, a feeder setup data preparation section 91 and a component information database 92. The input section 83 is provided for being manipulated by the worker to input necessary information, data and the like. This input section 83 also functions as a support place position designation device, by which the positions of the backup pins 41b constituting the support places of the backup device 40 for supporting the board can be designated at desired positions on a surface side image and/or a reverse side image being displayed in the display section 84. The display section 84 is provided for displaying various states of control. Another output section (printer section) may be provided in place of the display section 84 (or, together with the display section 84).

The memory section 85 stores CAD data for boards acquired from the board designing CAD system, production programs prepared based on the CAD data, image information on boards to be produced, backup pin coordinate data, planting sequence data of the backup pins, feeder setup data, and line construction data of the electronic component mounting line 10 which the host computer 80 controls wholly.

The production program preparation section 86 prepares a production program (mounting program) shown in FIG. 6 based on board CAD data that is, IDs of the components to be mounted, the kinds of the components, and the mounting positions (coordinate values) which have been acquired from the board designing CAD system to be stored in the memory section 85. The production program is composed of the IDs of the components to be mounted, the mounting coordinates, the mounting orders, and the designations of electronic component mounting apparatuses for performing the mountings. The production program shown in FIG. 6 is a production program for performing the mountings on the surface side of a board Sa shown in FIG. 7(a) by the three electronic component mounting apparatuses. FIGS. 7(a) and 7(b) respectively show the states of the surface side and the reverse side of the board Sa which respectively have components mounted thereon. The surface side of the board Sa has mounted thereon one piece of component Xaa, one piece of component Xbb, five pieces of components Xcc, three pieces of components Xdd and four pieces of components Xee, while the reverse side of the board Sa has mounted thereon thirteen pieces of components Xff. It is to be noted that in the present embodiment, description has been omitted as to a production program for components to be mounted on the reverse side.

Figure 8:
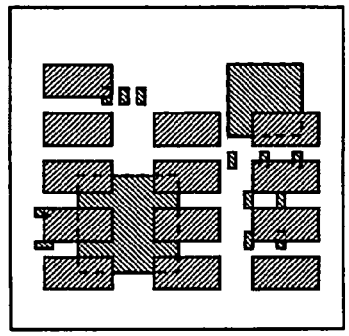
FIG. 8 is a superposed image prepared by the host computer shown in FIG. 1.

The image data preparation section 87 prepares production board image information, that is, a superposed image shown in FIG. 8 based on the board CAD data which has been stored after being acquired from the board designing CAD system or based on the production program prepared in the production program preparation section 86. The image data preparation section 87 also has a function as a superposed image preparation device for preparing the superposed image by superposing the surface side image and the reverse side image.

Figure 9:
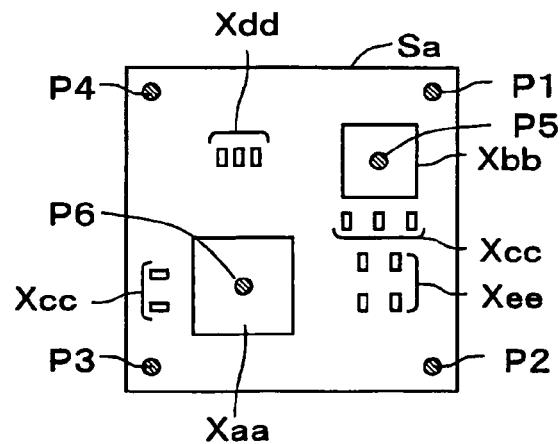
FIG. 9 is a chart showing planting positions of backup pins designated by a worker.

When the positions P1 through P6 of the backup pins 41b are designated by the worker by reference to the superposed image prepared in the image data preparation section 87 (refer to FIG. 9), the backup pin coordinate data preparation section 88 prepares backup pin coordinate data shown in FIG. 10 by correlating the IDs of the backup pins 41b with the coordinates of the designated positions P1 through P6. The backup pin coordinate data is constituted by the ID of each backup pin, the setting of the backup pin, the position coordinate of the backup pin, and, in the case of the backup pin being set to be a particular component support place, a RefList indicating the ID of a component for which the backup pin operates as a support. The abbreviation "RefList" in this description and the accompanying drawings means a reference ID list of a component.

When the planting orders of the designated backup pins 41b are input by the worker, the planting sequence data preparation section 89 prepares planting sequence data for the backup pins as shown in FIG. 11 by correlating the planting orders with the IDs of respective backup pins 41b. The planting sequence data of each backup pin is composed of the ID and the planting order of the backup pin.

The feeder setup data preparation section 91 prepares feeder setup data shown in FIG. 12, in which each component ID is correlated with the ID of each cassette type feeder 51 set in the component supply device 50 of each electronic component mounting apparatus 20, based on the production program. The feeder setup data is composed of the ID of each cassette type feeder 51 and the ID of the component to be mounted.

The component information data base 92 stores information about mounting speeds, the kinds of mounting nozzles to be used, and the like for all of the components to be mounted.

Next, the procedures for determining the positions of the support places by the use of the aforementioned support place (backup pin) position determination device will be described with reference to a flow chart shown in FIG. 13. The host computer 80 being the support place position determination device obtains production board information, that is, the aforementioned board CAD data from the board designing CAD system 95 for storage in the memory section 85 (step 102). The host computer 80 prepares the aforementioned production program by adding the component mounting orders and the designations of the electronic component mounting apparatuses which are to undertake mountings (step 104). The prepared production program is stored in the memory section 85. It is to be noted that the component mounting orders and the designations of the electronic component mounting apparatuses which are to undertake mountings may be input by the worker or may be automatically set by the host computer 80.

Figure 7:
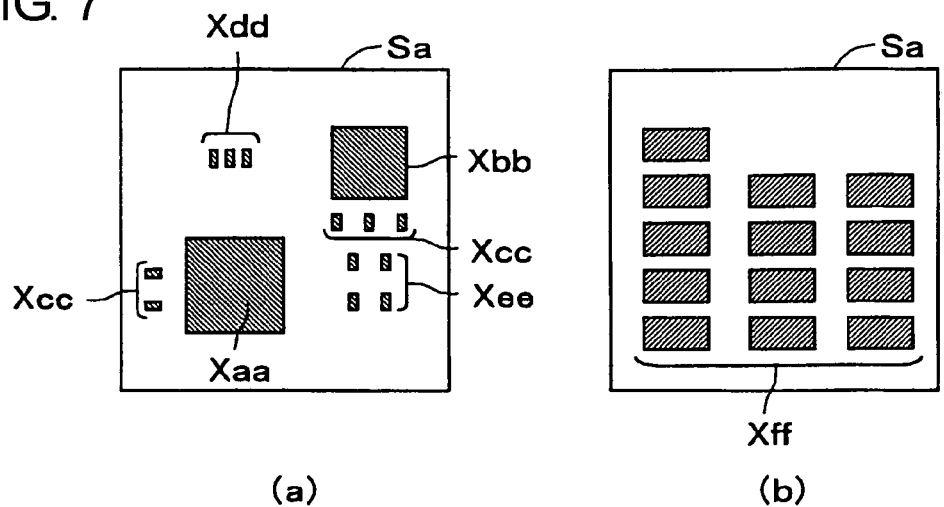
FIG. 7(a) is an explanatory view showing a surface side image prepared by the host computer shown in FIG. 1.
FIG. 7(b) an explanatory view showing a reverse side image prepared by the host computer shown in FIG. 1.

At step 106, the host computer 80 first prepares a surface side image (refer to FIG. 7(*a*)) and a reverse side image (refer to FIG. 7(*b*)) which respectively show the surface and reverse sides of each board having components mounted thereon, based on the production board information or the production program. Each of these images is constituted by at least the outline of the board and the outlines of the components. Where the board has holes and slits inside thereof, it is preferable for the image to include the outlines of these holes and slits. Then, the host computer 80 superposes the prepared surface side image and reverse side image in the same coordinate system to display them as a superposed image (the production board image) in the display section 84 (refer to FIG. 8). At this time, it is desired to display the components mounted on the surface side of the board and the components mounted on the reverse side of the board respectively in visually different modes. This may be done by displaying the components mounted on the surface side and the reverse side respectively in red and green for example. Further, it is preferable to display planting inhibition areas for the backup pins at the same time. The planting inhibition areas are the areas in which the positions of the pins interfere with the components on the support surface, that is, the areas which are set to prevent the pins from interfering with the components on the support surface, and are set based on the outlined areas of the components and the external dimensions of the pins. Where the worker designates a pin position within any of the planting inhibition areas, it is desirable to inhibit such designation and to alert that such designation is not allowed.

The host computer 80 displays the prepared superposed image in the display section 84 at step 108. Then, when the positions P1 through P6 of the backup pins 41*b* are designated by the worker on the superposed image (refer to FIG. 9), the host computer 80 calculates respective coordinate values (X1, Y1) through (X6, Y6) of the designated positions and correlates them with the IDs of the backup pins 41*b* thereby to prepare the backup pin coordinate data (refer to FIG. 10). The planting positions for the backup pins with IDs of 1 through 6 respectively correspond to P1 through P6. When the positions for the backup pins 41*b* are designated by the worker, selection is simultaneously made by the worker as to whether each of the backup pins 41*b* is to serve as a support place for preventing flexure or as a support place for a particular component. The settings for such selections are also correlated with the IDs of the backup pins 41*b*. It is to be noted that only when a backup pin 41*b* is set as a support place for a particular component, the ID of the component supported by the backup pin 41 is correlated in the RefList for such setting.

The flexure preventing support place is a support place which is provided for the purpose of preventing the board from being flexed or warped by its gravity. Where the board is produced by way of the plural electronic component mounting apparatuses, the flexure preventing support place is provided in common to all of the electronic component mounting apparatuses. The particular component support place is a support place which is provided for the purpose of supporting a particular component (e.g., the component narrow in the pitch of terminals such as those known as QFP, SOP, BGA, CSP) which is required to be positioned highly precisely so that the particular component is not dislocated by the shock during the mounting operation. Where the board is produced by way of the plural electronic component mounting apparatuses, the particular component support place is provided only in one which operates for the mounting of the particular component.

When the planting orders of the backup pins 41*b* whose positions have been designated are input by the worker, the host computer 80 at step 110 prepares the plating sequence data for the backup pins by correlating the planting orders with the IDs of the backup pins. That is, as shown in FIG. 11, a pin ID1 is designated as first, a pin ID5 is designated as second, a pin ID2 is designated as third, a pin ID3 is designated as fourth, a pin ID6 is designated as fifth and a pin ID4 is designated as sixth.

At step 112, the host computer 80 prepares production programs for respective electronic component mounting apparatuses by splitting the production program into those for the respective electronic component mounting apparatuses, and at step 114, prepares feeder setup data for respective electronic component mounting apparatuses 20, that is, for the first to third electronic component mounting apparatuses 11 to 13 based on those production programs split for the respective electronic component mounting apparatuses (refer to FIG. 12).

Then, at step 116, the host computer 80 transmits each production program for each electronic component mounting apparatus and each feeder setup data for each electronic component mounting apparatus to a corresponding electronic component mounting apparatus 20 and further transmits the backup pin coordinate data to all the electronic component mounting apparatuses 20.

Figures 14, 15:
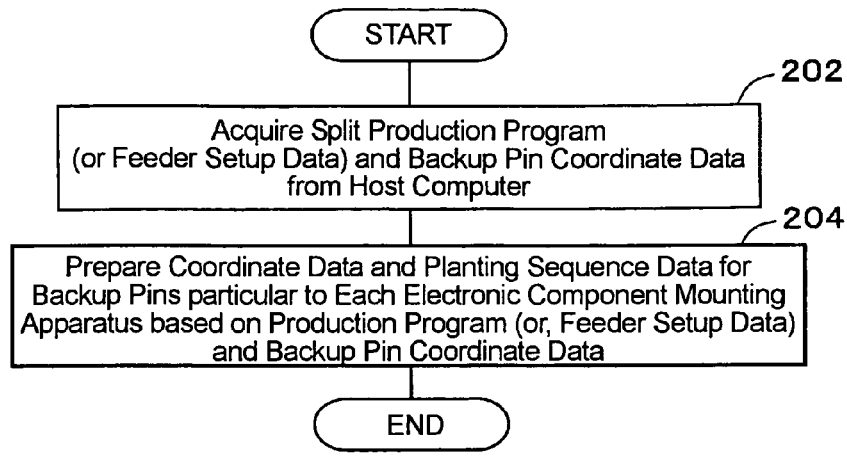
FIG. 14 is a flow chart showing a program executed by each electronic component mounting apparatus shown in FIG. 1.

Each of the first to third electronic component mounting apparatuses 11 to 13 executes a program corresponding to a flow chart shown in FIG. 14 thereby to prepare the backup pin coordinate data and the planting sequence data for the backup device 40 of each electronic component mounting apparatus 20. Specifically, the control device 70 of each electronic component mounting apparatus 20 acquires from the host computer 80 the split production program for the associated electronic component mounting apparatus 20 (or the feeder setup data for the associated electronic component mounting apparatus 20) and the backup pin coordinate data (step 202) and prepares the coordinate data and the planting sequence data for the backup pins particular to the associated electronic component mounting apparatus 20 based on the acquired production program for the associated electronic component mounting apparatus 20 (or the acquired feeder setup data for the associated electronic component mounting apparatus 20) and the acquired backup pin coordinate data (step 204). Thus, it can be done to select the backup pins which are necessary to each electronic component mounting apparatus 20.

Figure 16:
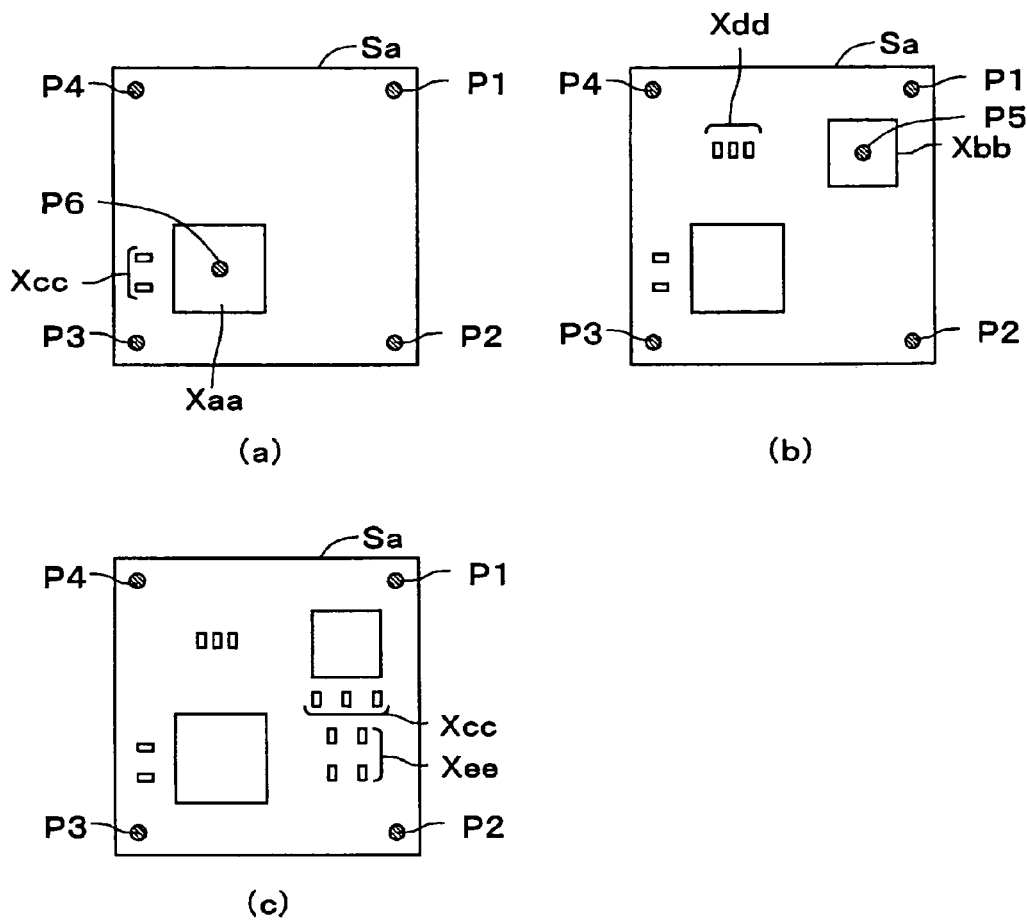
FIG. 16(a) is a chart showing backup pin planting positions for the first electronic component mounting apparatus.
FIG. 16(b) is a chart showing backup pin planting positions for the second electronic component mounting apparatus.
FIG. 16(c) is a chart showing backup pin planting positions for the third electronic component mounting apparatus.

For example, the first electronic component mounting apparatus 11 mounts the components (designated by the feeder setup data shown in FIG. 12(*a*)) being the first to third in mounting order of the production program shown in FIG. 6. Since a particular component Xaa is included in these components, the backup pins to be planted on the first electronic component mounting apparatus 11 become those designated by ID1 to ID4 and ID6 of the backup pin coordinate data shown in FIG. 10. FIG. 15(*a*) shows the coordinate data and the planting sequence data for these backup pins, and FIG. 16(*a*) shows the components Xcc and Xaa, mounted by the first electronic component mounting apparatus 11, and the support positions P1-P4 and P6 of the backup pins 41*b*.

Further, the second electronic component mounting apparatus 12 mounts the components (designated by the feeder setup data shown in FIG. 12(*b*)) being the fourth to seventh in mounting order of the production program shown in FIG. 6. Since another particular component Xbb is included in these components, the backup pins to be planted on the second electronic component mounting apparatus 12 become those designated by ID1 to ID5 of the backup pin coordinate data shown in FIG. 10. FIG. 15(*b*) shows the coordinate data and the planting sequence data for these backup pins, and FIG. 16(*b*) shows the components Xdd and Xbb, mounted by the second electronic component mounting apparatus 12, and the support positions P1-P5 of the backup pins 41*b*.

Further, the third electronic component mounting apparatus 13 mounts the components (designated by the feeder setup data shown in FIG. 12(*c*)) being the eighth to fourteenth in mounting order of the production program shown in FIG. 6. Since no particular component is included in these components, the backup pins to be planted on the third electronic component mounting apparatus 13 become those designated by ID1 to ID4 of the backup pin coordinate data shown in FIG. 10. FIG. 15(*c*) shows the coordinate data and the planting sequence data for these backup pins, and FIG. 16(*c*) shows the components Xcc and Xee, mounted by the third electronic component mounting apparatus 13, and the support positions P1-P4 of the backup pins 41*b*.

As is clear from the foregoing description, in the present embodiment, prior to mounting components on the surface side and reverse side of each board by the electronic component mounting apparatus 20, the worker recognizes the mounting surface on which each component is to be mounted, by reference to the superposed image being displayed in the display section 84 of the host computer 80, designates the positions of the backup pins 41*b* while avoiding the components on each support surface based on such recognition, and further designates as the position of a backup pin 41*b* a reverse side portion corresponding to the mounting surface portion on which a particular component is to be mounted highly precisely. Therefore, it can be realized to determine the positions for the backup pins properly. Further, since setting is made as to whether each backup pin 41*b* is to serve as a flexure preventing support place for preventing the flexure of the board or as a particular component support place for supporting a particular component which requires high precision mounting, it can be realized to usefully provide the backup pins 41*b* necessary for each electronic component mounting apparatus 20. Accordingly, it becomes possible to reduce the cost involved in the works for setting the backup pins 41*b* on the backup device 40 and for exchanging the backup pins 41*b*.

Further, in the foregoing embodiment, the step 108 (support place position determination step) further includes the support object component correlating step for correlating the backup pin 41*b* set as the particular component support place with the information relating to a particular component to be supported by the backup pin 41*b*. Therefore, in addition to the foregoing functions and effects, it can be realized to confirm the component which is to be supported by a backup pin 41*b* serving as the particular component support place.

Further, in the foregoing embodiment, the step 204 (support place position determination step dedicated to the associated electronic component mounting apparatus) which is a step independently executed by the associated electronic component mounting apparatus 20 is further included for determining the positions of the backup pins 41*b* to be used on the associated electronic component mounting apparatus by reference to the support place data (the backup pin coordinate data) and the mounted component data (the production program or the feed setup data). The support place data is prepared through the step 108 (the support place position determination step and the support object component correlating step) and is composed of the positions relating to all the support places supporting a board, the setting state of the support places and the support object components, whereas the mounted component data is for designating the components which are of those components to be mounted on a board and which are to be mounted by the associated electronic component mounting apparatus. With this construction, in addition to the foregoing functions and effects, it can be further realized to reliably determine the backup pins 41*b* which are necessary to each electronic component mounting apparatus 20.

Further, in the foregoing embodiment, the determination inhibition step is further included for inhibiting the determination at step 108 if the position of any of the backup pins 41*b* determined at the step 108 (support place position determination step) is within the area where it interferes with a component on a support surface. Thus, it can be avoided reliably to erroneously set the position of any backup pin 41*b* on a component having been mounted on a support surface of the board.

Further, in the foregoing embodiment, the support place position determination aiding device for the backup device is provided with a display section control device (the control section 81) for controllably displaying in the display section 84 the surface side image and the reverse side image which respectively show the surface side and the reverse side of the board having components mounted thereon, a support place position designation device (the input section 83) capable of designating the positions of the backup pins 41*b*, which are support places of the backup device 40 for supporting the board, at desired positions on the surface side image and/or the reverse side image being displayed in the display section 84, and a superposed image preparation device (the image data preparation section 87) for preparing a superposed image by superposing the surface side image and the reverse side image. The display section control device (the control section 81) controllably displays the surface side image and the reverse side image included in the superposed image in visually different modes. With this construction, in the support place position determination aiding device for the backup device, the display section control device displays the surface side image and the reverse side image included in the superposed image in the visual modes which are different from each other, and the worker designates the positions of the support places while avoiding the components on the support surface by reference to the displayed superposed image and further designates as the position of a support place a board reverse side portion corresponding to a mounting side portion on which a component is to be mounted highly precisely, by the use of the support place position designation device. Accordingly, it is possible to aid the worker in determining the support places reliably and accurately.

Although the foregoing embodiment is constructed to display the superposed image in the display section 84 of the host computer 80, the superposed image may be printed out. In this case, the positions of the backup pins 41*b* may be designated on a printed material, and the coordinates of such positions may be manually input into the host computer 80 or may be scanned by using a scanner.

Further, in the foregoing embodiment, the components mounted on the surface side of a board and those mounted on the reverse side of the board may be displayed at step 108 to be switched in display mode. With this construction, in mounting components on the surface side and the reverse side of a board by the electronic component mounting apparatus, it can be realized to display a superposed image accurately regardless of whether the mountings are performed first from the surface side or first from the reverse side.

Further, although in the foregoing embodiment, the support places of the backup device 40 are constructed by the backup pins, the support places of the backup device 40 may be constructed by support places of block shapes, or the backup device may be constructed by that of a vacuum backup type having a function of sucking a board by a vacuum power.

INDUSTRIAL APPLICABILITY

As described above, the support place position determination method and the support place position determination device according to the present invention are capable of displaying the support places in an area wherein the support places can be arranged, together with the mounting positions for the components which are required to be mounted highly precisely and hence, are suitable for use in determining the positions of the support places properly.

The invention claimed is:

1. A support place position determination method in a backup device of determining the positions of support places of the backup device which supports a board at a support surface on a reverse side of a component mounting surface in mounting components on the board by an electronic component mounting apparatus, the method comprising:
   a superposed image display step of displaying a surface side image and a reverse side image which respectively show a surface side and a reverse side of the board having components mounted thereon, with the images being superposed, and of displaying components mounted on the surface side of the board and components mounted on the reverse side in visually different modes; and
   a support place position determination step of designating and determining the positions of the support places of the backup device on the superposed image being displayed at the superposed image display step.

2. The support place position determination method in the backup device as set forth in claim 1 wherein at the superposed image display step, the components mounted on the surface side of the board and the components mounted on the reverse side of the board are displayed to be switched in display mode.

3. The support place position determination method in the backup device as set forth in claim 1 further comprising:
   a determination inhibition step of inhibiting the determination at the support place position determination step if the position of any support place determined at the support place position determination step is within an area which causes an interference with a component on the support surface.

4. A support place position determination device for determining the positions of support places of a backup device which supports a board at a support surface on a reverse side of a component mounting surface in mounting components, the support place position determination device comprising:
   display means for displaying a surface side image and a reverse side image which respectively show a surface side and a reverse side of the board having components mounted thereon, with the images being superposed, and for displaying components mounted on the surface side of the board and components mounted on the reverse side in visually different modes; and
   support place position determination means for designating and determining the positions of the support places of the backup device on the superposed image being displayed by the display means.

5. A support place position determination aiding device comprising:
   a display section control device for controllably displaying in a display section a surface side image and a reverse side image which respectively show a surface side and a reverse side of the board having components mounted thereon;
   a support place position designation device capable of designating the positions of support places of a backup device for supporting a board, at desired positions on the surface side image and/or the reverse side image being displayed in the display section; and
   a superposed image preparation device for superposing the surface side image and the reverse side image to prepare a superposed image;
   wherein the display section control device controllably displays the surface side image and the reverse side image included in the superposed image in visually different modes.

6. A support place position determination method in a backup device of determining the positions of support places of the backup device which supports a board at a support surface on a reverse side of the component mounting surface in mounting components on the board by one or plural electronic component mounting apparatuses, the method including:
   a support place position determination step of designating and determining the positions of the support places of the backup device while setting each support place of the backup device to either a flexure preventing support place for preventing the flexure of the board or a particular component support place for supporting a particular component for which highly precise mounting is required,
   a support object component correlating step of correlating a support place which is set to the particular component support place at the support place position determination step, with information about a particular component to be supported by the support place; and
   a support place position determination step dedicated to each electronic component mounting apparatus, wherein the dedicated support place position determination step is a step, independently executed in the associated electronic component mounting apparatus, of determining the positions of support places used in the associated electronic component mounting apparatus by reference to support place data and mounting component data, the support place data being prepared through the support place position determination step and the support object component correlating step and being composed of positions relating to all the support places for supporting the board, setting states of the support places and support object components, and the mounting component data being for designating those components, whose mountings are to be performed by the associated electronic component mounting apparatus, of the components to be mounted on the board.

7. A support place position determination method of determining positions of support places where a backup device provided in one or each of plural electronic component mounting apparatuses supports a board at a support surface on a reverse side of a component mounting surface in mounting electronic components on the board, the method comprising:

a support place position determination step of designating and determining the positions of the support places of the backup device, the support places including at least one flexure preventing support place for preventing the flexure of the board and at least one particular component support place for supporting a particular electronic component for which precise mounting is required;

wherein the support place position determination step includes inputting information for setting each support place of the backup device to either the at least one flexure preventing support place or the at least one particular component support place, wherein the inputting the informing includes:

a support object component correlating step of correlating a support place which is set to the particular component support place at the support place position determination step, with information about a particular electronic component to be supported at the particular component support place; and further comprising a support place position determination step dedicated to each electronic component mounting apparatus, wherein the dedicated support place position determination step is a step, independently executed in the associated electronic component mounting apparatus, of determining the positions of support places used in the associated electronic component mounting apparatus by reference to support place data and mounting component data, the support place data being prepared through the support place position determination step and the support object component correlating step and being composed of positions relating to all the support places for supporting the board, setting states of the support places and support object components, and the mounting component data being for designating those components, whose mountings are to be performed by the associated electronic component mounting apparatus, of the electronic components to be mounted on the board.

* * * * *